United States Patent [19]

Tanaka et al.

[11] Patent Number: 4,494,219
[45] Date of Patent: Jan. 15, 1985

[54] NONVOLATILE READ ONLY MEMORY DEVICE

[75] Inventors: Sumio Tanaka; Shigeyoshi Watanabe, both of Tokyo, Japan

[73] Assignee: Tokyo Shibaura Denki Kabushiki Kaisha, Japan

[21] Appl. No.: 344,050

[22] Filed: Jan. 29, 1982

[30] Foreign Application Priority Data

Feb. 5, 1981 [JP] Japan ................................. 56-14986

[51] Int. Cl.³ ............................................... G11C 7/00
[52] U.S. Cl. .................................... 365/189; 365/207; 365/210
[58] Field of Search ............... 365/189, 205, 207, 210, 365/230

[56] References Cited

U.S. PATENT DOCUMENTS 4,223,394 9/1980 Pathak et al. ...................... 365/189

Primary Examiner—James W. Moffitt
Attorney, Agent, or Firm—Finnegan, Henderson, Farabow, Garrett & Dunner

[57] ABSTRACT

A nonvolatile read only memory detects a time varying change of the amount of data written in the memory cell transistor using a circuit for supplying a constant potential which is higher than the threshold voltage of a reference cell transistor and which is independent of a power source voltage used for reading out connected to the gate of the reference cell transistor.

9 Claims, 8 Drawing Figures

F I G. 4
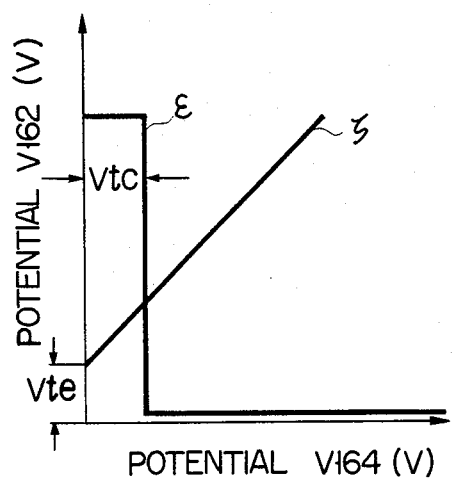
F I G. 6
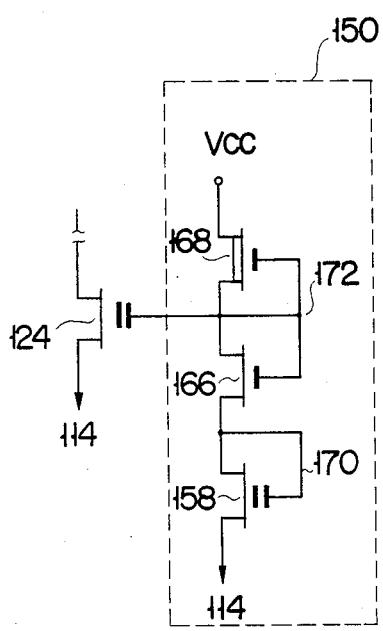
F I G. 5
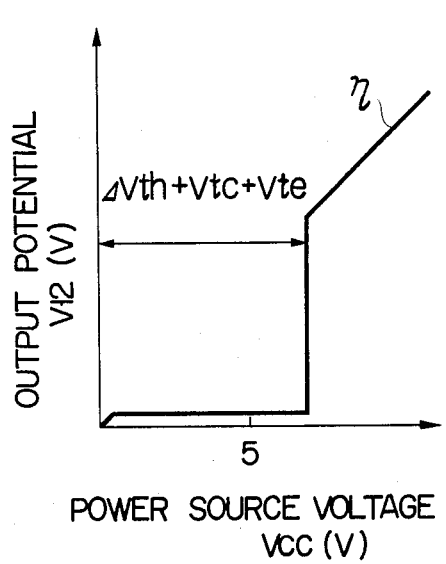

NONVOLATILE READ ONLY MEMORY DEVICE

BACKGROUND OF THE INVENTION

The present invention relates to a nonvolatile read only memory device.

A nonvolatile read only memory (abbreviated as ROM) has dominantly used for memory devices for storing programs in electronic computers and fixed data.

A prior ROM will be described with reference to FIGS. 1 and 2. In FIG. 1 illustrating a circuit diagram of a prior ROM, the ROM includes a MOS transistor (referred to as a memory cell transistor) having an N-channel dual gate structure formed on a P substrate and serving as a memory cell. The memory cell transistor 10 has a channel length of 2.5 μm, and a threshold value of 1.4 V. The transistor 10 is one of the memory cell transistors forming a memory array. The memory cell transistor 10 is connected at the gate to a row decoder 12 through a word line 13, at the source to a ground potential point 14, and at the drain to a digit line 16 connected to the drains of other memory cell transistors (not shown). The digit line 16 is connected through an enhancement type (referred to as E-type) transistor 18 to a first bias circuit 20. The gate of the transistor 18, connected to a column selection line 22 connected to a column decoder, receives a column selection signal.

The gate of a MOS transistor of the dual gate structure for a reference potential generation (referred to as a reference cell transistor) is connected to a node between transistors 26 and 28 of the depletion type(-referred to as D-type). A channel length of a reference cell transistor 24 is 2.5 μm and a threshold voltage thereof is 1.4 V. The source of the transistor 26 is connected to the ground potential point 14 and a power source voltage Vcc of 5 V, for example, is supplied to the drain of the transistor 28. Accordingly, the potential at the node 30 corresponds to the one formed by resistor-division of the potential Vcc through the transistors 26 and 28.

The reference cell transistor 24 is connected at the source to the ground potential point 14 and at the drain to a second bias circuit 34 through an E-type transistor 32 which is supplied at the gate with the power source voltage Vcc. Accordingly, the reference potential generated by the reference cell transistor 24 is supplied through the transistor 32 to the second bias circuit 34. The output signal V11 generated by the first bias circuit 20 and the output signal V21 by the second bias circuit 34 are applied to a differential amplifier 36. The output signal from the differential amplifier 36 is applied to an amplifier 38 which in turn produces output signals V12 and V22. The threshold voltage of each of the E-type transistors 18 and 32 is 0.7 V, and the threshold voltage of each of the D-type transistors 26 and 28 is −3.0 V.

The operation of the circuit as mentioned above will be described. For selecting a specific memory cell transistor, for example, the memory cell transistor 10, in the memory array, the potential of the output signal from the row decoder 12 and on the column select line 22 is set at a high level of approximately 5 V. At this time, the potential V11 on the output line 40 of the first bias circuit 20 is determined due to a conductance ratio of the first bias circuit 20 and the memory cell transistor 10. When the memory cell transistor 10 is in a non-write mode the conductance of the memory cell transistor 10 is large, so that the potential V11 is at a low level. On the other hand, when the memory cell transistor 10 is in a write mode, the conductance of the memory cell transistor 10 is small, so that the potential V11 is at a high level.

The potential V21 on the output line 42 from the second bias circuit 34 is likewise determined by a conductance ratio of the second bias circuit 34 and the reference cell transistor 24. It is assumed that the memory cell transistor 10 and the reference cell transistor 24 are manufactured by the same process, and with the same dimension. The power source voltage of 5 V is applied to the gate of the memory cell transistor 28 and a voltage of 3 V, for example, which is dropped by the D-type transistor 28, is applied to the gate of the reference cell transistor 24. Accordingly, the potential on the output line 42 from the second bias circuit 34 is between high and low levels of the potential V11 appearing on the output line 40 from the first bias circuit 20.

A difference potential between the output potentials V11 and V21 is detected by the differential amplifier 36. The difference potential is amplified by the amplifier 38 and the amplifier 38 produces digital signals V12 and V22 on the output lines 44 and 46. When the potential V11 on the output line 40 from the first bias circuit 20 is logical "0", for example, the digital signals V12 and V22 are logical "1" and "0", respectively.

Normally, the output signal from the row decoder 12 is proportional to the power source voltage Vcc. If, assuming that an amount of data written in the memory cell transistor 10 (referred to as a data write amount) is ΔVth and the threshold voltage of the transistor 10 in a non-write mode is Vtc, the current through the transistor 10 is proportional to (Vcc−ΔVth−Vtc). The gate potential of the reference cell transistor 24 is approximately Vcc−α. α is determined by the conductance ratio of the D-type transistors 26 and 28.

If the reference cell transistor 24 has much the same dimension as that of the memory cell transistor 10, the threshold voltage of the reference cell transistor 24 is equal to that Vtc of the memory cell transistor 10 in a non-write mode. Therefore, the current flowing through the reference cell transistor 24 is proportional to Vcc−α−Vtc. When the current of the reference cell transistor 24 is larger than that of the memory cell transistor 24 in a write mode, the following relation holds $$Vcc - \Delta Vth - Vtc < Vcc - \alpha - Vtc$$

Hence, $$\Delta Vth > \alpha$$

When the write amount in the memory cell transistor 10 is larger than α, the output potential V11 of the first bias circuit 20 is higher than the output potential V21 of the second bias circuit 34. The digital signal V12 generated by the amplifier 38 is low in level, independently of the power source voltage.

FIG. 2 shows a relationship between the power source voltage Vcc and the output potential V12 of the amplifier 38. In the figure, β designates a relationship when no data is written into the memory cell transistor 10 (ΔVth=0) and γ designates a relationship when ΔVth>α. In a practical power voltage range, when ΔVth=0, the output potential V12 is high level. When ΔVth>α, the output potential V12 is low in level. Normally, the ROM is used under the condition given by the curves β and γ.

A curve δ designates a relationship when $0<\Delta V_{th}<\alpha$. The data write amount in the memory cell transistor 10 changes with time, so that $0<\Delta V_{th}<\alpha$ is satisfied. In this state, when the power source voltage Vcc is increased, the output potential V12 of the amplifier 38 changes from high level into low level at a certain power source voltage Vcc. Therefore, a change in the write amount of the memory cell transistor 10 can be detected.

On the other hand, in the case of the curve γ which satisfies the relationship $\Delta V_{th}>\alpha$, the output potential V12 of the amplifier 38 exhibits no change, even if the power source voltage Vcc is changed. Therefore, a time variation of the write amount can not be detected. In the nonvolatile read only memory, it is desirable to check at a desired time a time variation of the memory contents once stored, for the purpose of checking the reliability of the ROM.

A ROM similar to the above-mentioned ROM is disclosed in Japanese patent publication (KOKAI) 2No. 51-94729.

SUMMARY OF THE INVENTION

Accordingly, an object of the present invention is to provide a nonvolatile read only memory device which can detect a time variation of the data write amount of the memory cell within a margin of the power source voltage.

To achieve the above object, a constant potential circuit for supplying a constant potential higher than a threshold value of a reference cell transistor and independent of a read out power voltage is connected to the gate of the reference cell transistor.

The nonvolatile read only memory device thus arranged can reliably detect a change of the threshold voltage of the memory cell transistor, thus improving a reliability of the memory device.

BRIEF DESCRIPTION OF THE DRAWINGS

Other objects and advantages of the invention will become apparent from the following detailed description when taken in conjunction with the accompanying drawings, in which:

FIG. 4 is a graph illustrating a relationship of a potential V164 at a node 164 in FIG. 3 vs. a potential V162 at a node 162;

FIG. 5 illustrates a relationship of a power source voltage Vcc and an output potential V12 in FIG. 3;

FIG. 6 is a circuit diagram illustrating another embodiment of constant potential circuit according to the present invention;

DETAILED DESCRIPTION OF THE PREFERRED EMBODIMENTS

Figure 3:
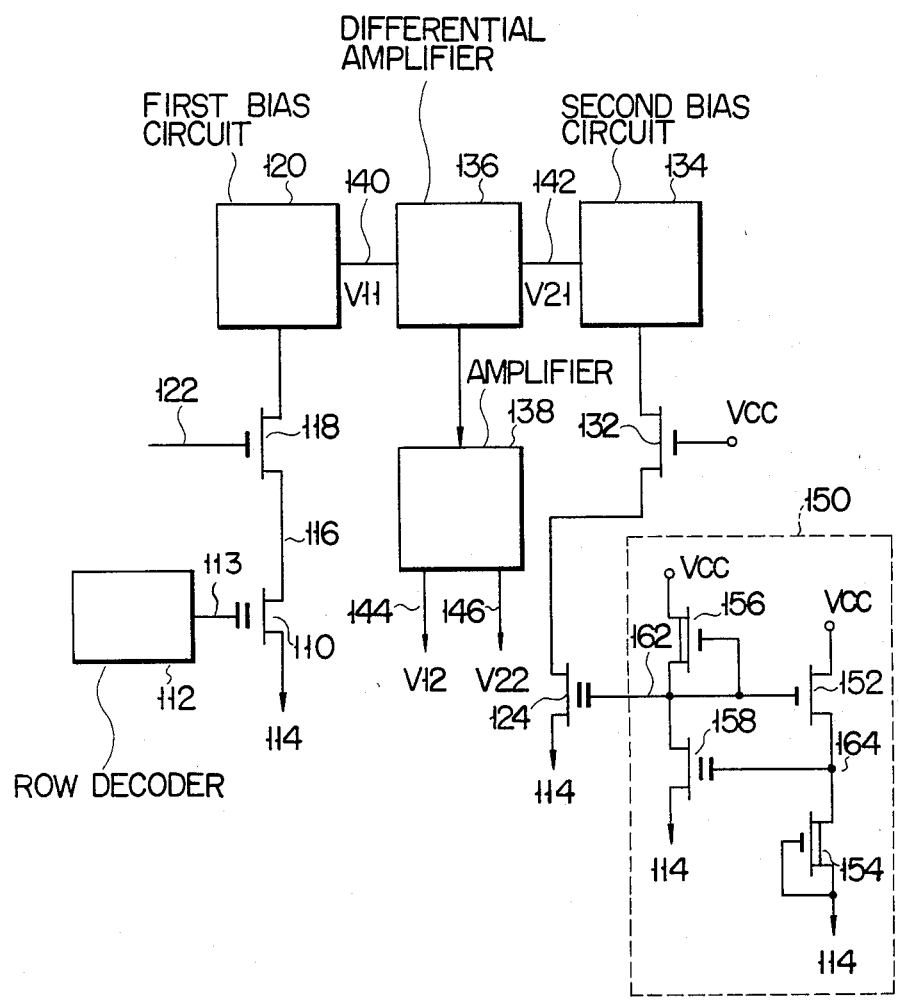
FIG. 3 is a circuit diagram of a first embodiment of a nonvolatile read only memory according to the present invention.

An embodiment of the present invention will be described referring to FIG. 3. FIG. 3 is a circuit diagram of a ROM according to the present invention. The ROM includes a memory cell transistor 110 having an N-channel dual gate structure provided on a P-type structure and serving as a memory cell. A channel length of the memory cell transistor 110 is 2.5 μm, for example, and the threshold voltage is 1.4 V. The memory cell transistor 110 is one of the memory cell transistors forming a memory cell array. The memory cell transistor 110 is connected at the gate to a row decoder 112 through a word line 113, at the source to the ground potential point 114, and at the drain to a digit line 116 connected commonly to the drains of other memory cell transistors (not shown). The digit line E-type transistor 118 for the column selection purposes. The gate of the transistor 118 is connected to a column selection line 122 connected to a column decoder, and receives a column selection signal.

A reference cell transistor 124 with the dual gate structure for the reference potential generation is connected at the source to the ground potential point 114, at the drain to a second bias circuit 134 through an E-type transistor 132 supplied at the gate with the power source voltage Vcc. The gate of the reference cell transistor 124 is supplied with a constant potential by a circuit for supplying a constant potential 150 (referred to as a constant potential circuit). Accordingly, the reference potential generated by the reference cell transistor 124 is supplied through the transistor 132 to the second bias circuit 134.

The output signal V11 from the first bias circuit 120 and the output signal V21 from the second bias circuit 134 are applied to a differential amplifier 136. An output signal from the differential amplifier 136 is inputted to an amplifier 138 which in turn produces output signals V12 and V22 on the output lines 144 and 146, respectively. The threshold voltages of the E-type transistors 118 and 132 are 0.7 V and those of the D-type transistors 154 and 156 are −3.0 V.

Figure 1:
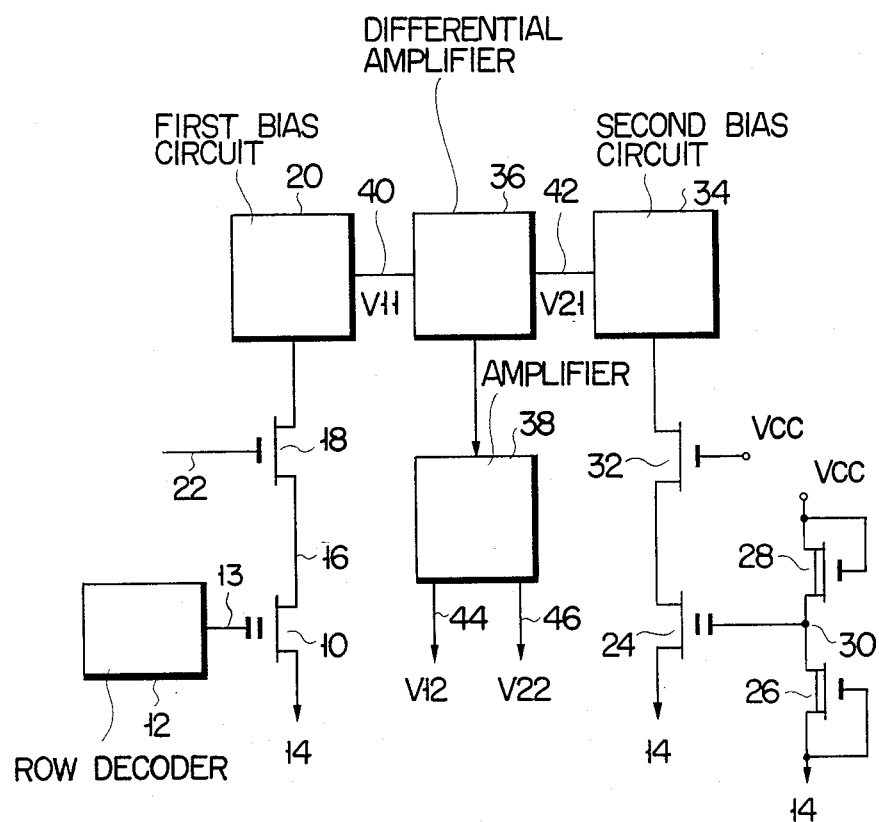
FIG. 1 is a circuit diagram of a prior nonvolatile read only memory.
Figure 2:
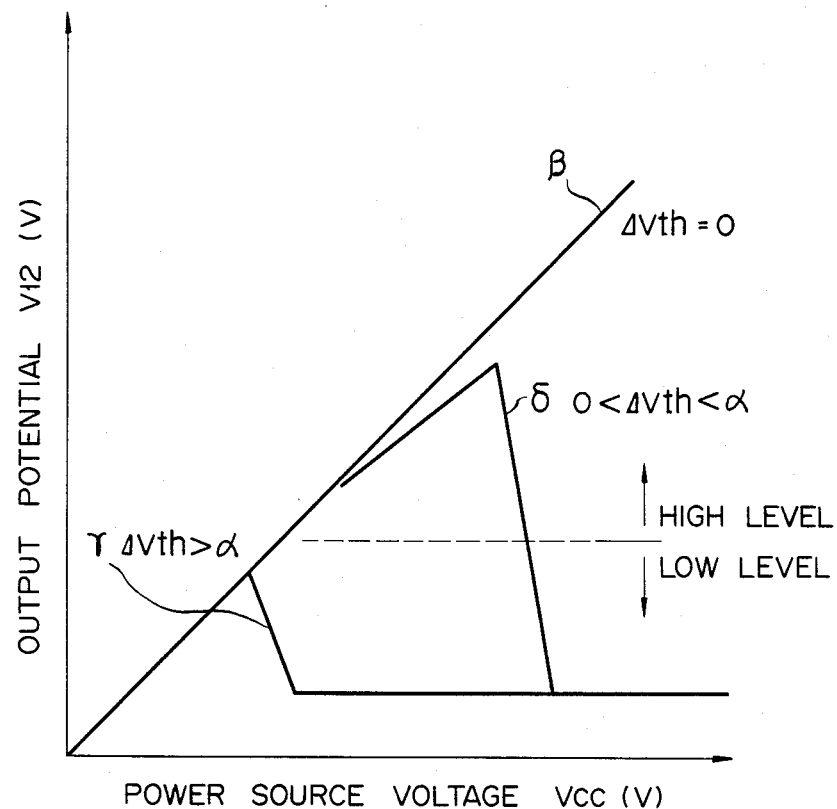
FIG. 2 shows a graph illustrating relationships between a power source voltage Vcc and an output potential V12 shown in FIG. 1, in a nonvolatile read only memory having various written data.

The circuit arrangement of the embodiment shown in FIG. 3 is the same as that of the prior art ROM device shown in FIG. 1, except for the constant potential circuit 150. Accordingly, only the constant potential circuit 150 will be described. The constant potential circuit 150 is comprised of an E-type transistor 152, D-type transistors 154 and 156, and a nonvolatile transistor 158 fabricated with the equal dimension as the memory cell transistor 110. The transistors 156 and 158 make up an E/D-type inverter with an input terminal of the node 164 and an output terminal of the node 162. The D-type transistor 156 is supplied at the drain with the power source voltage Vcc, and is connected at the gate and source to the node 162 and the drain of the nonvolatile transistor 158. The source of the transistor 158 is connected to the ground potential point 114, and at the gate to the node 164 between the transistors 152 and 154 inserted in series between the power source voltage Vcc and the ground potential 114. The gate of the E-type transistor 152 is connected to the node 162 and the gate of the D-type transistor 154 is connected to the source.

The conductance of the transistor 156 is selected at a value smaller than that of the transistor 158. A relationship between the potentials V162 at the node 162 and the potential V164 at the node 164 is given by a curve $\epsilon$ in FIG. 4, where Vtc denotes the threshold voltage of the transistor 158. If it is assumed that the threshold voltage of the transistor 152 is Vte, a relation V162=V164+Vte holds between the potentials V162 and V164, through the transistor V152. This relation is plotted as a curve $\zeta$ in FIG. 4. A stable point of the potentials V162 and V164 is a cross point of the curves $\epsilon$ and $\zeta$. The potential V162 is Vtc+Vte, and the potential V164 is Vtc. The D-type transistor 154 is provided to prevent the potential V164 from being in a floating state. The conductance of the transistor 154 is sufficiently smaller than that of the transistor 152, thereby preventing the potential V164 from being stabilized at a higher potential than the potential V162.

The operation of the nonvolatile read only memory shown in FIG. 3 will be described. As previously stated, the current flowing through the memory cell transistor 110 is proportional to Vcc−ΔVth−Vtc. The current flowing through the reference cell transistor 124 is proportional to ((Vtc+Vte)−Vtc), since V162=Vtc+Vte. The latter Vtc is the threshold voltage of the reference cell transistor. Accordingly, when (Vcc−ΔVth−Vtc)<Vte, that is, Vcc<(Vtc+ΔVth)+Vte, the conductance of the memory cell transistor 110 is decreased smaller than the conductance of the reference cell transistor 124. As a result, the potential V11 on the output line 140 is higher than the potential V21 on the output line 142, and the output potential V12 is low in level.

When Vcc>(Vtc+ΔVth)+Vte, the output potential V12 is high in level.

A curve $\eta$ in FIG. 5 represents a relationship between the power source voltage Vcc and the output potential V12.

As described above, the output potential V12 changes with a change of the power source voltage Vcc. Accordingly, by measuring the power source voltage Vcc (=ΔVth+Vtc+Vte) at which the output potential V12 changes from low to high level, the data write amount ΔVth of the memory cell transistor 110 can be detected. In the prior nonvolatile read only memory, when the data write amount ΔVth is above $\alpha$, it is impossible to detect how the write amount is left. In this respect, the reliability of the nonvolatile read only memory can not be checked. According to the nonvolatile read only memory of the present invention, the write amount can be checked, thereby improving the reliability of the memory elements.

A second embodiment of a nonvolatile read only memory according to the present invention will be described referring to FIG. 6. FIG. 6 shows another constant potential circuit 150 which is composed of a dual gate transistor 158 manufactured with the same dimension as the reference cell transistor 124, an E-type transistor 166 and a D-type transistor 168. The source of the transistor 158 is connected to the ground potential point 114 and the drain of the transistor 158 is connected to the gate per se and to the source of the E-type transistor 166. The drain of the E-type transistor 166 is connected to the gate per se, the gate of the reference cell transistor 124, and the gate and source of the D-type transistor 168. The power source voltage Vcc is supplied to the drain of the transistor 168. The transistor 168 has a constant current characteristic. When the conductances of the transistors 158 and 166 are selected at values much larger than that of the transistor 168, the potential V170 at the node 170 is equal to the threshold voltage Vtc of the transistor 158 and the potential V172 at the node 172 is the sum of the threshold voltage Vtc of the transistor 158 and the threshold voltage Vte of the transistor 166. Accordingly, (Vtc+Vte) is applied to the gate of the reference cell transistor 124.

Figure 7:
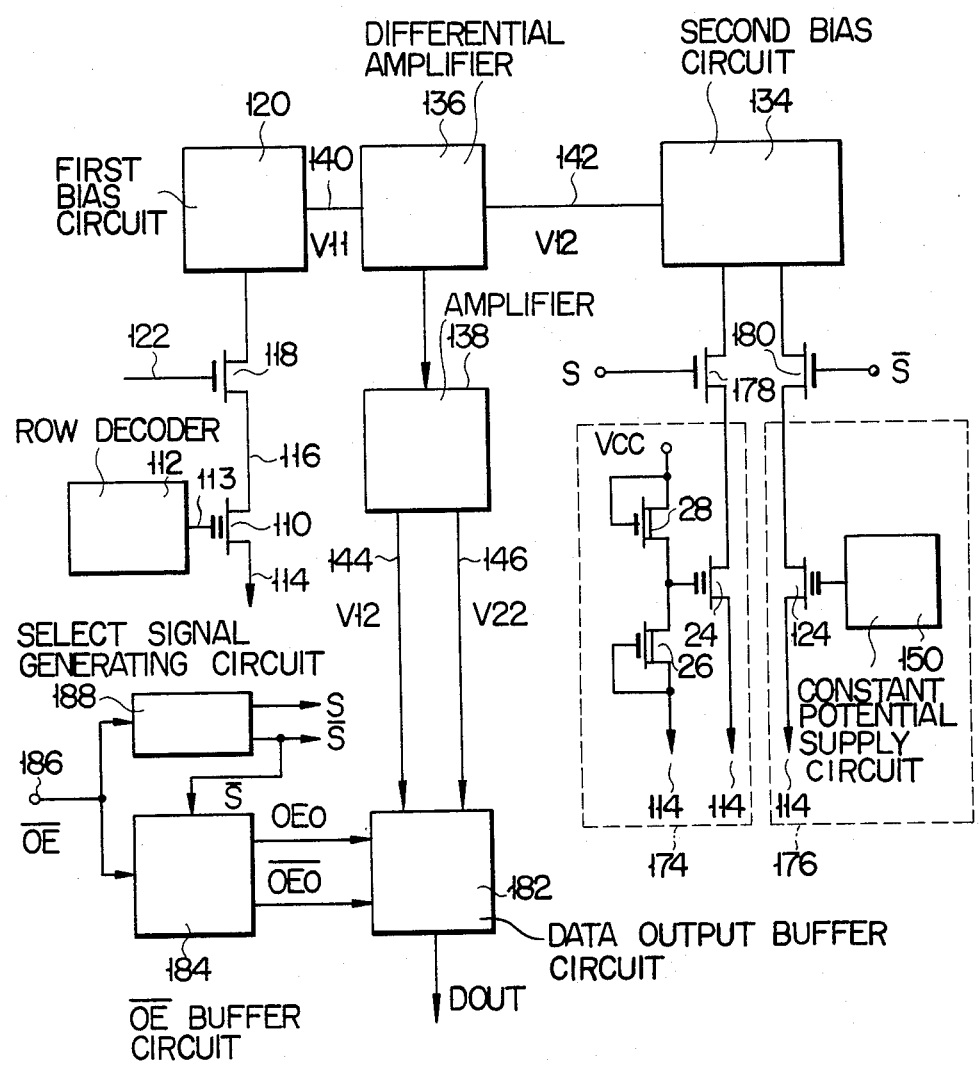
FIG. 7 is a circuit diagram of a third embodiment of a nonvolatile read only memory according to the present invention.

A third embodiment of a nonvolatile read only memory according to the present invention will be described referring to FIG. 7. The nonvolatile read only memory shown in FIG. 7 has a conventional reference circuit 174 including the transistors 24, 26 and 28 shown in FIG. 1, and a reference circuit 176 including a constant potential circuit 150 according to the present invention, as shown in FIGS. 3 and 6, and a reference cell transistor 124. The reference circuit 174 is connected through an E-type transistor 178 to the second bias circuit 134, while the reference circuit 176 is connected through an E-type transistor 180 to the second bias circuit 134.

Select signals S and $\overline{S}$, which are related to each other in an inverted manner, are applied to the gates of the transistors 178 and 180, respectively. The reference circuits 174 and 176 are alternatively selected by the transistors 178 and 180. When the select signal S at a high level is applied to the gate of the transistor 178, the select signal $\overline{S}$ at a low level is applied to the gate of the transistor 180. Accordingly, the conventional reference circuit 174 operates. In an inverse case, the reference circuit 176 operates. Meanwhile, when the conventional reference circuit 174 is used, the differential amplifier 136 operates even if the data write amount ΔVth is at approximately 2 V. Accordingly, the write time can be reduced. In the screening process, the threshold voltage of the memory cell transistor may be estimated by operating the reference circuit 176.

The select signals S and $\overline{S}$ may readily be produced in the following manner. The nonvolatile read only memory has a data output buffer circuit 182 to which the output signals V12 and V22 from the amplifier 138 are supplied, as shown in FIG. 7. The data output buffer circuit 182 is driven by an $\overline{OE}$ buffer circuit 184. In a normal use condition, output buffer signals OEo and $\overline{OEo}$ are generated from to which an output buffer enable signal $\overline{OE}$ which is inputted through a terminal 186 and has high level voltage 5 V and a low level voltage 0 V. The terminal 186 is also used to generate the select signals S and $\overline{S}$. A select signal generating circuit 188 is connected to the terminal 186 in parallel with the $\overline{OE}$ buffer circuit 184. For detecting the data write amount, a high voltage of about 12 V is applied to the terminal 186, thereby to form a low level select signal S and a high level select signal $\overline{S}$. Accordingly, the reference circuit 176 operates. However, when a high voltage signal is applied to the terminal 186, the output signal OEo from the $\overline{OE}$ buffer circuit 184 becomes high in level, so that the data output buffer circuit 182 is in a non-read out state. As a result, the data write amount can not be detected. To prevent this drawback, the output signal $\overline{S}$ from the select signal generating circuit 188 is applied to the $\overline{OE}$ buffer circuit 184. When the select signal $\overline{S}$ is high in level, the output signal OEo from the $\overline{OE}$ buffer circuit is necessarily low in level even if the high level signal is applied to the terminal 186.

On the other hand, when the output buffer enable signal $\overline{OE}$ is applied to the terminal 186, the select signal generating circuit 188 produces a high level select signal S and a low level select signal $\overline{S}$. Accordingly, in a normal data read out mode, the reference circuit 174 operates. When the output buffer enable signal $\overline{OE}$ is applied to the terminal 186, the select signal $\bar{S}$ is in low level, and therefore the $\overline{OE}$ buffer circuit also operates normally.

Figure 8:
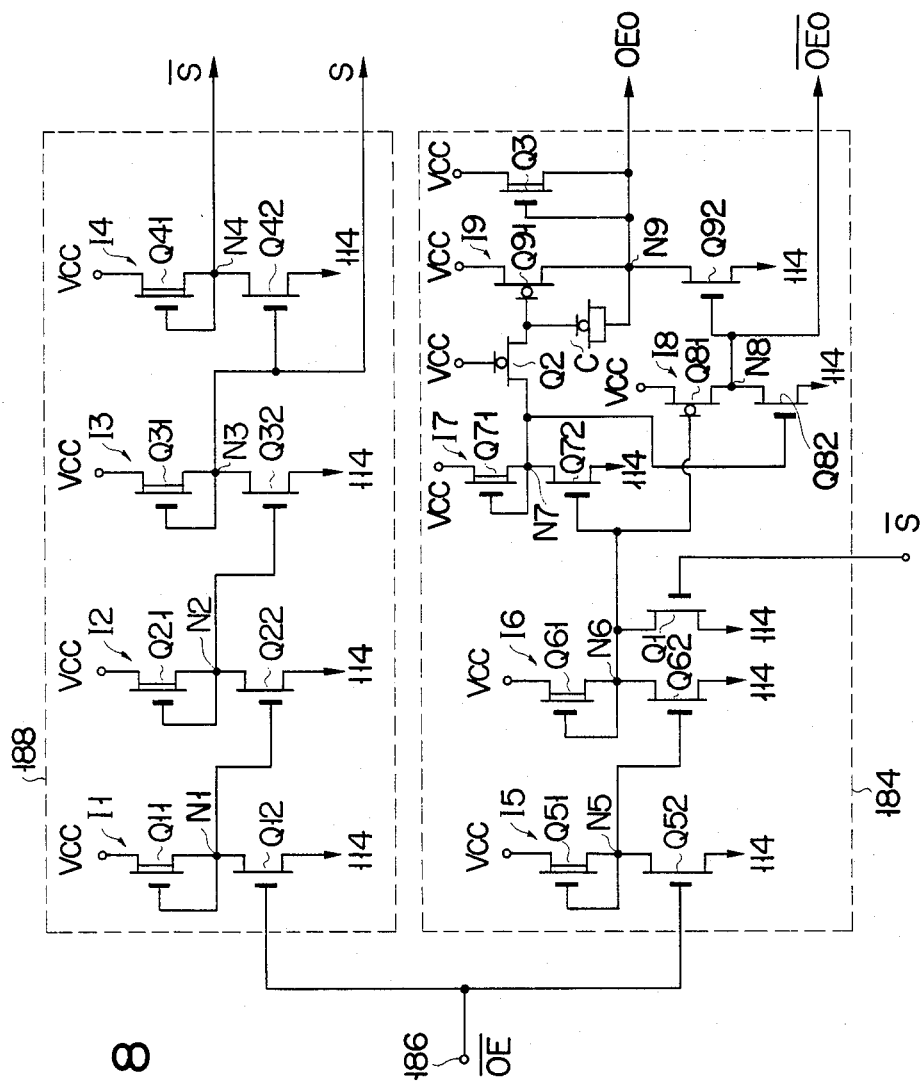
FIG. 8 is a circuit diagram containing a select signal generating circuit shown in FIG. 7 and an $\overline{OE}$ buffer circuit.

FIG. 8 shows a circuit diagram of a select signal generating circuit 188 and an $\overline{OE}$ buffer circuit 184. The select signal generating circuit 188 is composed of four inverters I1 to I4 connected in series. The inverter I1 is composed of a D-type transistor Q11 and an E-type transistor Q12; the inverter I2 is composed of a D-type transistor Q21 and, E-type transistor Q22; the inverter I3 is composed of a D-type transistor Q31 and an E-type transistor Q32; the inverter I4 is composed of a D-type transistor Q41 and an E-type transistor Q42. The gate of the transistor Q12 is connected to a terminal 186. A select signal S is produced from the node N3 between the transistors Q31 and Q32. A select signal $\bar{S}$ is produced from a node N4 between the transistors Q41 and Q42. Reference numerals N1 and N2 represent nodes between the transistors Q11 and Q12, and between the transistors Q21 and Q22, respectively. The threshold voltage of the inverter I1 is set at 8 V, for example.

The $\overline{OE}$ buffer circuit 184 is composed of inverters I5 to I9, an E-type transistor Q1, an intrinsic transistor Q2, a D-type transistor Q3 and a bootstrap capacitor C. The inverter I5 is comprosed of a D-type transistor Q51 and an E-type transistor Q52 connected at the gate to the terminal 186. The inverter I6 is composed of a D-type transistor Q61 and an E-type transistor Q62 connected at the gate to the node N5 between the transistors Q51 and Q52.

The transistor Q1 is arranged between the node N6 of the transistors Q61 and Q62 and the ground potential point. The transistor Q1 receives at the gate the select signal $\bar{S}$ from the select signal generating circuit 188. The inverter I7 is made up of a D-type transistor Q71 and an E-type transistor Q72 of which the gate is connected to the node N6. The inverter I8 is made up of a transistor Q81 of the intrinsic type connected at the gate to the node N6 and an E-type transistor Q82 connected at the gate to a node N7 between the transistors Q71 and Q72. The inverter I9 is composed of an intrinsic type transistor Q91 connected at the gate to the node N7 through the intrinsic type transistor Q2, and an E-type transistor Q92 connected at the gate to a node N8 between the transistors Q81 and Q82. A bootstrap capacitor C is connected at one end to the gate of the transistor Q91, and at the other end to a node N9 between the transistors Q91 and Q92.

The D-type transistor Q3 is supplied at one end with the power source voltage Vcc, and connected at the other end to its gate and to the node N9. The output signal OEo from the $\overline{OE}$ buffer circuit 184 is produced at the node N9.

The output signal $\overline{OEo}$ which is the inverted output signal OEo is produced at the node N8. The output signal OEo and the output buffer enable signal $\overline{OE}$ are opposite in polarity, while the output signal $\overline{OEo}$ and the signal $\overline{OE}$ have the same polarity. The output signals OEo and $\overline{OEo}$ are supplied to the data output buffer circuit 182. When the $\overline{OEo}$ is low in level, a signal with the same logic polarity as that of the signal V12 appears at the output DOUT. When the signal $\overline{OEo}$ is high in level, the output DOUT is in a tristate, that is, in a floating state. In the $\overline{OE}$ buffer circuit 184 and a select signal generating circuit 188 thus constructed, when the output buffer enable signal $\overline{OE}$ at 0 V is inputted into the terminal 186, the select signal S is at 5 V and the select signal $\bar{S}$ is at 0 V. The output signal OEo is at 5 V and the output signal $\overline{OEo}$ is 0 V. At this time, the data output buffer circuit 182 is in a read out mode, and the reference circuit 174 operates.

If the output buffer enable signal $\overline{OE}$ at 5 V is applied to the terminal 186, the select signal generating circuit 188 does not operate because the threshold voltage of the inverter I1 is 8 V. Accordingly, the select signal S is 5 V, while the select signal $\bar{S}$ is left at 0 V. Further, the output signal OEo is 0 V, and $\overline{OEo}$ is 5 V. Accordingly, the data output buffer circuit 182 is in a non-read out mode and the reference circuit 174 operates.

With detecting the write state, a 12 V voltage is applied to the terminal 186. In this case, the output node N1 of the inverter I1 is at 0 V, so that the select signal generating circuit 188 produces a select signal S at 0 V and a select signal $\bar{S}$ at 5 V. Accordingly, the reference circuit 176 starts to operate and the select signal $\bar{S}$ of 5 V is applied to the gate of the transistor Q1 of the $\overline{OE}$ buffer circuit 184 to set the node N6 at a low level. Accordingly, the output signal OEo is at 5 V, and the output signal $\overline{OEo}$ is at 0 V. Consequently, the data output buffer circuit 182 performs a read out operation. Under this condition, if the voltage $\Delta Vth + Vtc + Vte$ in FIG. 5 is measured by changing the power source voltage Vcc, the data write amount of the memory cell transistor 110 may be estimated.

The circuit for generating the select signal is not limited to the above-mentioned embodiment. For example, the select signal generating circuit may be connected to the terminal for supplying the chip enable signal or the terminal for supplying the program control signal. A pad for the select signal generating circuit may of course be provided.

What we claim is:

1. A nonvolatile read only memory comprising:
   a word line
   a nonvolatile memory cell transistor connected at the gate to said word line;
   first and second MOS transistors;
   first bias circuit for biasing through said first MOS transitor a common read-out node connected to the drain of said memory cell transistor;
   a reference cell transistor for detecting a threshold voltage of said memory cell transistor;
   a constant potential circuit for applying to the gate of said reference cell transistor a constant voltage which is higher than the threshold voltage of said reference cell transistor and independent of a power source voltage for reading out;
   a second bias circuit for biasing through said second MOS transistor the output of said reference cell transistor; and
   a differential amplifier for amplifying a difference between voltage signals from said first and second bias circuits.

2. A nonvolatile read only memory comprising:
   a word line;
   a nonvolatile memory cell transistor connected at the gate to said word line;
   first and second MOS transistors;
   a first bias circuit for biasing through said first MOS transistor a common read-out node connected to the drain of said memory cell transistor;
   a reference cell transistor for detecting a threshold voltage of said memory cell transistor;
   a constant potential circuit for applying to the gate of said reference cell transistor a constant voltage which is higher than the threshold voltage of said reference cell transistor and independent of a power source voltage for reading out;

a second bias circuit for biasing through said second MOS transistor the output of said reference cell transisotr;

a differential amplifier for amplifying a difference between voltage signals from said first and second bias circuits;

wherein said constant potential circuit includes a third MOS transistor of an enhancement type which receives at one end the power source voltage;

a fourth MOS transistor of a depletion type which is connected at one end to the other end of said third MOS transistor and at the gate to its other end and to a reference potential;

a fifth MOS transistor of a depletion type which is supplied at one end with the power source voltage, and connected at the gate to its other end and to the gate of said third MOS transistor; and a sixth nonvolatile MOS transistor which is connected at one end to the other end of said fifth MOS transistor, at the other end to a reference potential, and at the gate to a node between said third and fourth MOS transistors.

3. A nonvolatile read only memory comprising:

a word line;

a nonvolatile memory cell transistor connected at the gate to said word line;

first and second MOS transistors;

a first bias circuit for biasing through said first MOS transistor a common read-out node connected to the drain of said memory cell transistor;

a reference cell transistor for detecting a threshold voltage of said memory cell transistor;

a constant potential circuit for applying to the gate of said reference cell transistor a constant voltage which is higher than the threshold voltage of said reference cell ransistor and independent of a power source voltage for reading out;

a second bias circuit for biasing through said second MOS transistor the output of said reference cell transistor;

a differential amplifier for amplifying a difference between voltage signals from said first and second bias circuits;

wherein said constant potential circuit includes a third MOS transistor of a depletion type which is supplied at one end with the power source voltage;

a fourth MOS transistor of an enhancement type which is connected at one end to the other end of said third MOS transistor, to its gate and to the gate of said third MOS transistor; and a fifth nonvolatile MOS transistor which is connected at one end to the other end of said fourth MOS transistor and to its gate, and at the other end to a reference potential.

4. A nonvolatile read only memory comprising:

a word line;

a nonvolatile memory cell transistor connected at the gate to said word line;

a first bias circuit for biasing through a first MOS transistor a common read-out node connected to the drain of said memory cell transistor;

a first reference cell transistor for reading out data of said memory cell transistor;

a circuit for resistor division of a power source voltage for reading out, and supplying the divided voltage to the gate of said first reference cell transistor;

a second reference cell transistor for detecting the threshold voltage of said memory cell transistor;

a constant potential circuit for supplying to the gate of said second reference cell transistor a constant voltage which is higher than the threshold voltage of said second reference cell transistor and independent of said power source voltage for reading out;

a second MOS transistor connected at one end to the output terminal of said first reference cell transistor;

a third MOS transistor connected at one end to the output terminal of said second reference cell transistor;

a second bias circuit connected to the other end of said second and third MOS transistor;

a circuit for supplying control signals, which are related each other in an inverted manner, to the gate of said second and third MOS transistors; and a differential amplifier for amplifying a difference between the voltage signals from said first and second bias circuits.

5. A nonvolatile read only memory according to claim 4, wherein said constant potential circuit comprises:

a fourth MOS transistor of an enhancement type which receives at one end the power source voltage;

a fifth MOS transistor of a depletion type which is connected at one end to the other end of said fourth MOS transistor and at the gate and other end to a reference potential;

a sixth MOS transistor of a depletion type which is supplied at one end with the power source voltage, and connected at the gate and at the other end to the gate of said fourth MOS transistor and an output terminal; and a seventh nonvolatile MOS transistor which is connected at one end to the other end of said sixth MOS transistor, at the other end to a reference potential, and at the gate to a node between said fourth and fifth MOS transistors.

6. A nonvolatile read only memory according to claim 4, wherein said constant potential circuit comprises:

a fourth MOS transistor of a depletion type which is supplied at one end with the power source voltage;

a fifth MOS transistor of an enhancement type which is connected at one end to the other end of said fourth MOS transistor, and to the gate per se and the gate of said fourth MOS transistor, a node between said fourth and fifth MOS transistors being connected to the output terminal; and a sixth nonvolatile MOS transistor which is connected at one end to the other end of said fifth MOS transistor and to the gate per se, and at the other end to a reference potential.

7. A nonvolatile read only memory according to claim 4, wherein said circuit for supplying control signals is connected to a terminal for supplying a control signal to supply a voltage higher than that in a normal operation.

8. A nonvolatile read only memory according to claim 7, wherein said circuit for supplying control signals comprises a plurality of inverters connected in series.

9. A nonvolatile read only memory according to claim 8, wherein said inverter connected to said terminal for supplying a control signal has a threshold voltage higher than a voltage used in a normal operation mode and comprises:

a fourth MOS transistor which is supplied at one end with the power source voltage; and
a fifth MOS transistor connected at one end to the gate and the other end of said fourth MOS transistor, supplied at the other end with a reference potential, and connected at the gate to said terminal for supplying a control signal.

* * * * *